(12) United States Patent
Chen

(10) Patent No.: US 9,435,844 B2
(45) Date of Patent: Sep. 6, 2016

(54) DEVICE AND METHOD FOR INVESTIGATING A CABLE SYSTEM

(71) Applicant: KONINKLIJKE PHILIPS N.V., Eindhoven (NL)

(72) Inventor: Hong Chen, Shanghai (CN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/893,999

(22) PCT Filed: Jun. 24, 2014

(86) PCT No.: PCT/IB2014/062550
§ 371 (c)(1),
(2) Date: Nov. 25, 2015

(87) PCT Pub. No.: WO2015/001448
PCT Pub. Date: Jan. 8, 2015

(65) Prior Publication Data
US 2016/0109499 A1    Apr. 21, 2016

(30) Foreign Application Priority Data

Jul. 2, 2013 (EP) .................................... 13175838
Jul. 2, 2013 (WO) ................. PCT/CN2013/078682

(51) Int. Cl.
*G01R 31/02* (2006.01)
(52) U.S. Cl.
CPC ........... *G01R 31/021* (2013.01); *G01R 31/024* (2013.01); *G01R 31/025* (2013.01)
(58) Field of Classification Search
CPC .................................................. G01R 31/021
USPC .................... 324/750.01, 658, 500, 534, 509
See application file for complete search history.

(56) References Cited

U.S. PATENT DOCUMENTS 3,944,914 A    3/1976  Simmonds
(Continued)

FOREIGN PATENT DOCUMENTS

CN    101635077 B    5/2012
GB    2275152 A      8/1994

OTHER PUBLICATIONS

Valdes, Marcelo et al "Finding Fault—Locating a Ground Fault in Low-Voltage, High Resistance Grounded Systems via the Single-Processor Concept for Circuit Protection", IEEE Industry Applications Magazine, IEEE Service Center, vol. 13, No. 5, Sep. 2007, pp. 24-30.

*Primary Examiner* — Arleen M Vazquez
*Assistant Examiner* — Robert P Alejnikov, Jr.

(57) ABSTRACT

Devices (10) support a use of investigation signals for investigating cable systems comprising cables (101) and loads (111). The loads (111) comprise rectifier circuits (201) coupled to storage circuits (202). The devices (10) comprise charger circuits (1) for producing charging signals for charging the storage circuits (202) such that they have reduced impacts on performances of the investigation signals. The devices (10) may further comprise discharger circuits (2) for discharging signaling circuits (121) after being charged by the charger circuits (1). The devices (10) may further comprise investigation circuits (3) for producing the investigation signals and controller circuits (4) for controlling the other circuits (1-3) and reception circuits (5) for receiving responses to the investigation signals and analysis circuits (6) for analyzing the responses in view of the investigation signals and for in response to analysis results defining a problem (102-104) and/or a location of a problem (102-104).

10 Claims, 4 Drawing Sheets

(56) References Cited

U.S. PATENT DOCUMENTS 4,394,616 A * 7/1983 Browne ................. G01V 1/20
 324/522
5,381,348 A 1/1995 Ernst 6,531,879 B1 * 3/2003 Nero, Jr. ................. H04B 3/46
 324/534
2009/0167314 A1 * 7/2009 Hoffmann ............ G01R 31/025
 324/509

* cited by examiner

US 9,435,844 B2

DEVICE AND METHOD FOR INVESTIGATING A CABLE SYSTEM

CROSS-REFERENCE TO PRIOR APPLICATIONS

This application is the U.S. National Phase application under 35 U.S.C. §371 of International Application No. PCT/IB2014/062550, filed on Jun. 24, 2014, which claims the benefit of European Patent Application No. 13175838.5, filed on Jul. 2, 2013 and Chinese Application No. PCT/CN2013/078682, filed on Jul. 2, 2013. These applications are hereby incorporated by reference herein.

FIELD OF THE INVENTION

The invention relates to a device for supporting a use of an investigation signal for investigating a cable system comprising a cable and a load, the load comprising a rectifier circuit with inputs coupled to the cable and with outputs coupled to a storage circuit.

The invention further relates to a package system, to a cable system, to a method, to a computer program product and to a medium.

Examples of such a load are lamps and appliances and computers and telecom equipment. Examples of such a cable are power cables and telecom cables.

BACKGROUND OF THE INVENTION

CN 101635077 A discloses an anti-theft detection method for a road lamp cable wherein an investigation signal in the form of a variable frequency input current signal is injected into the road lamp cable and wherein output current signals and output voltage signals are to be measured for different frequencies of the input current signal and wherein resonance frequencies of road lamps are to be taken into account and wherein a number of actual road lamps needs to be known. This way, in a relatively complex manner, the road lamp cable can be monitored.

A cable system comprises a cable and one or more loads. In case the loads comprise rectifier circuits with inputs coupled to the cable and with outputs coupled to storage circuits, the storage circuits may have a relatively large impact on the investigation signal and may make it difficult or even impossible to use the investigation signal.

SUMMARY OF THE INVENTION

It is an object of the invention to provide a device for supporting a use of an investigation signal for investigating a cable system comprising a cable and a load, the load comprising a rectifier circuit with inputs coupled to the cable and with outputs coupled to a storage circuit. Further objects of the invention are to provide a package system, a cable system, a method, a computer program product and a medium.

According to a first aspect, a device is provided for supporting a use of an investigation signal for investigating a cable system comprising a cable and a load, the load comprising a rectifier circuit with inputs coupled to the cable and with outputs coupled to a storage circuit, the device comprising
 a charger circuit for producing a charging signal for charging the storage circuit, an investigation circuit (3) for producing the investigation signal, and a controller circuit (4) for controlling the charger circuit (1) to producing the charging signal before the investigation circuit (4) producing the investigation signal.

the charged storage circuit having, compared to the non-charged storage circuit, an at least reduced impact on a performance of the investigation signal.

A cable system comprises a cable and one or more loads. The loads comprise rectifier circuits with inputs coupled to the cable and with outputs coupled to storage circuits. To investigate the cable system, an investigation signal is produced. A first example of such an investigation signal is a pulse signal, that is reflected by an "open" or a "short" in the cable, or that is reflected by a signaling circuit that when activated changes an impedance of the cable system at the load and that has been activated in response to a problem in or near a load, such as a malfunctioning load or a broken fuse between the load and the cable etc. The time between a transmission of the pulse and a reception of its reflection multiplied with the speed of the pulse through the cable and divided by two is indicative for a location of the problem. A second example of an investigation signal is an injection of several signals at several frequencies into the cable, whereby responses are measured and a characteristic frequency is calculated from these responses. A difference between a recently calculated characteristic frequency and a reference characteristic frequency as calculated shortly after installation is indicative for a problem, such as an "open" or a "short" in the cable or such as a problem that results in an activated signaling circuit. From the recently calculated characteristic frequency, a location of the problem can be derived, given the characteristics of the cable and of a possible signaling circuit. When a signaling circuit comprising a signaling capacitor having a capacitance value C has been activated, a characteristic frequency $f_{char}$ will be equal to one divided by a product of two and pi and a root of the capacitance value C and an inductance value L. From this equation, the inductance value L can be calculated, owing to the fact that the characteristic frequency $f_{char}$ can be measured and owing to the fact that the capacitance value C of the signaling capacitor is known. This way, the value of the inductance L of the cable can be derived. In view of the fact that an inductance value of a cable per distance unit is defined by specification, the derived value is indicative for a location of the problem.

The storage circuits may absorb the investigation signal and may produce an unwanted response to such an investigation signal. In both cases, the storage circuits will have a relatively large impact on a performance of the investigation signal, and an investigation of the cable system may be disturbed by these storage circuits. By having added a charger circuit for producing a charging signal for charging the storage circuit, the charged storage circuit will have, compared to the non-charged storage circuit, an at least reduced impact on a performance of the investigation signal. As a result, even in case loads with rectifier circuits and storage circuits are present, the cable system can be investigated, and this is a great advantage. As an example only, a storage circuit may for example comprise a storage capacitor.

An embodiment of the device is defined by the at least reduced impact being no impact at all. Preferably, the charged storage circuit will have no impact at all on a performance of the investigation signal. Thereto, the storage circuit should be charged sufficiently.

An embodiment of the device is defined by a voltage amplitude of the investigation signal being equal to or smaller than a sum of a voltage amplitude present across the rectifier circuit and a voltage amplitude present across the charged storage circuit. As an example only, in case a voltage amplitude of the investigation signal is equal to or smaller than a sum of a voltage amplitude present across the rectifier circuit and a voltage amplitude present across the charged storage circuit, the charged storage circuit will have no impact at all on a performance of the investigation signal.

An embodiment of the device is defined by the cable system further comprising a signaling circuit located between the load and the cable, the device further comprising a discharger circuit for discharging the signaling circuit after being charged by the charger circuit. In case a signaling circuit is present between the load and the cable, which signaling circuit in response to a detection of a problem in or near the load is activated and which signaling circuit in an activated mode is configured to change an impedance of the cable at the location of the load, the signaling circuit may be charged too by the charger circuit. To avoid that the charged signaling circuit, because of being charged, is no longer visible to the investigation signal, the signaling circuit is to be discharged before the investigation signal is produced. This discharging is realized via the discharging circuit. In the load, the rectifier circuit will prevent that the storage circuit is discharged too by the discharging circuit. As an example only, a signaling circuit may for example comprise a signaling capacitor that in response to a detection of a problem in or near the load is being connected to the cable.

An embodiment of the device is defined by further comprising an investigation circuit for producing the investigation signal, and a controller circuit for controlling the charger circuit and the investigation circuit. Examples of the investigation circuit are generators and swept-tuned-analyzers and Fast-Fourier-Transform-analyzers. Examples of the controller circuit are controllers and processors. Functions of the investigation circuit may be realized via the controller circuit. The controller circuit for example controls the charger circuit, the discharger circuit and the investigation circuit such that firstly the charger circuit is switched on and then switched off, secondly the discharger circuit is switched on and then switched off, and thirdly the investigation circuit is switched on and then switched off.

An embodiment of the device is defined by further comprising a reception circuit for receiving a response to the investigation signal, and an analysis circuit for analyzing the response in view of the investigation signal and for in response to an analysis result defining a problem and/or a location of a problem. Examples of the reception circuit are receivers. Examples of the analysis circuit are calculators. The reception circuit and/or the analysis circuit may form part of the investigation circuit. Functions of the reception circuit and/or of the analysis circuit may be realized via the controller circuit. The controller circuit for example controls the investigation circuit, the reception circuit and the analysis circuit such that firstly the investigation circuit and the reception circuit are switched on and then switched off, and secondly the analysis circuit is switched on and then switched off. Alternatively, they are all switched on during a same time-interval.

According to a second aspect, a package system is provided comprising the device as defined above and further comprising another device with an investigation circuit for producing the investigation signal.

According to a third aspect, a cable system is provided comprising a cable and a load, the load comprising a rectifier circuit with inputs coupled to the cable and with outputs coupled to a storage circuit, the cable system further comprising the device as defined above.

According to a fourth aspect, a method is provided for supporting a use of an investigation signal for investigating a cable system comprising a cable and a load, the load comprising a rectifier circuit with inputs coupled to the cable and with outputs coupled to a storage circuit, the method comprising a step of producing a charging signal for charging the storage circuit, and the method further comprising the following step after step of producing the charging signal, producing the investigation signal.

The charged storage circuit having, compared to the non-charged storage circuit, an at least reduced impact on a performance of the investigation signal.

According to a fifth aspect, a computer program product is provided for, when run on a computer, performing the step of the method as defined above.

According to a sixth aspect, a medium is provided for storing and comprising the computer program product as defined above.

A basic idea is that in a load comprising a rectifier circuit and a storage circuit the storage circuit is to be charged to make it less visible/invisible to an investigation signal.

A problem to provide a device has been solved. A further advantage is that the device is simple, low cost and robust and that many different kinds of cable systems can be investigated.

These and other aspects of the invention will be apparent from and elucidated with reference to the embodiments described hereinafter.

DETAILED DESCRIPTION OF EMBODIMENTS

Figure 1:
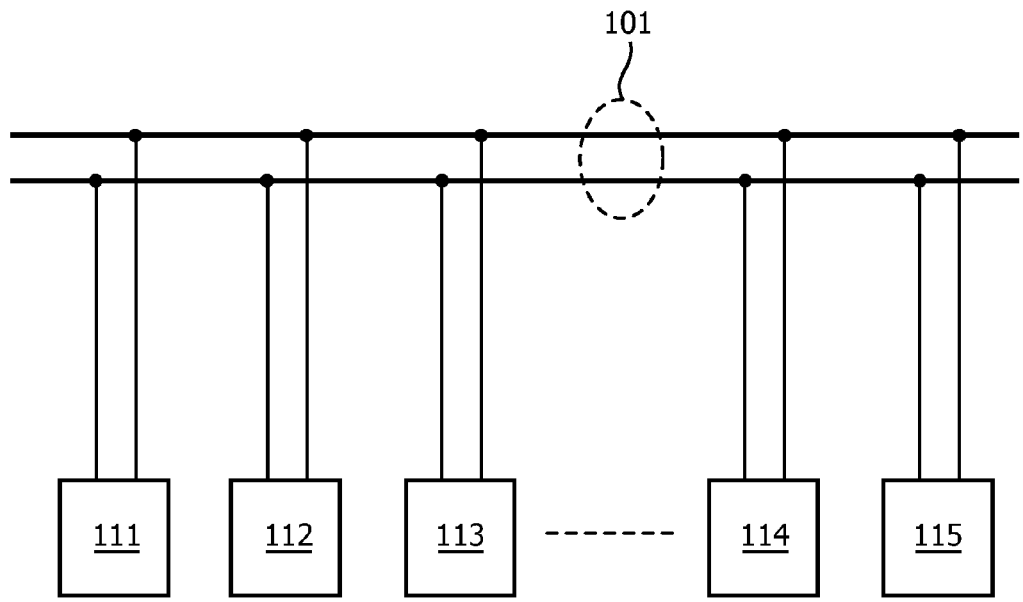
FIG. 1 shows a prior art cable system.

In the FIG. 1, a prior art cable system is shown, comprising a cable 101 and loads 111-115. Each load 111-115 is coupled to first and second conductors of the cable 101 directly or indirectly via one or more elements or via a signaling circuit all not shown here.

The load 111-115 may be any kind of load, such as a lamp, for example comprising one or more light emitting diodes. Other kinds of loads such as appliances and computers and telecom equipment are not to be excluded. Alternatively, one of the conductors of the cable 101 may be arranged otherwise, for example via the ground.

Figure 2:
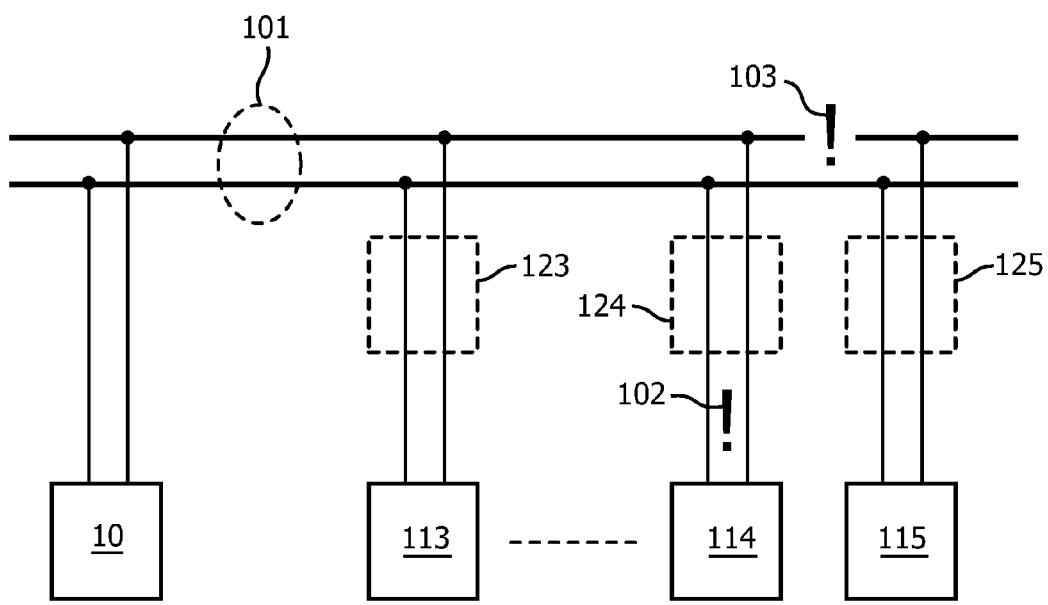
FIG. 2 shows a device coupled to a malfunctioning cable system.

In the FIG. 2, a device 10 coupled to a malfunctioning cable system is shown. The device 10 is coupled to first and second conductors of the cable 101 directly or indirectly via one or more elements not shown here. The cable system comprises the cable 101 and the loads 113-115 coupled to the first and second conductors of the cable 101 via signaling circuits 123-125. Each signaling circuit 123-125 for example comprises a signaling capacitor that in response to a detection of a problem in or near the load 113-115 is activated and is being connected to the first and second conductors of the cable 101 to change an impedance of the cable. In the FIG. 2, a first problem 102 has occurred in or near the load 114, and as a result the signaling circuit 124 has been activated. In the FIG. 2, a second problem 103 has occurred in one of the conductors of the cable 101 between the load 114 and the load 115, such as an "open" or a "short".

Figure 3:
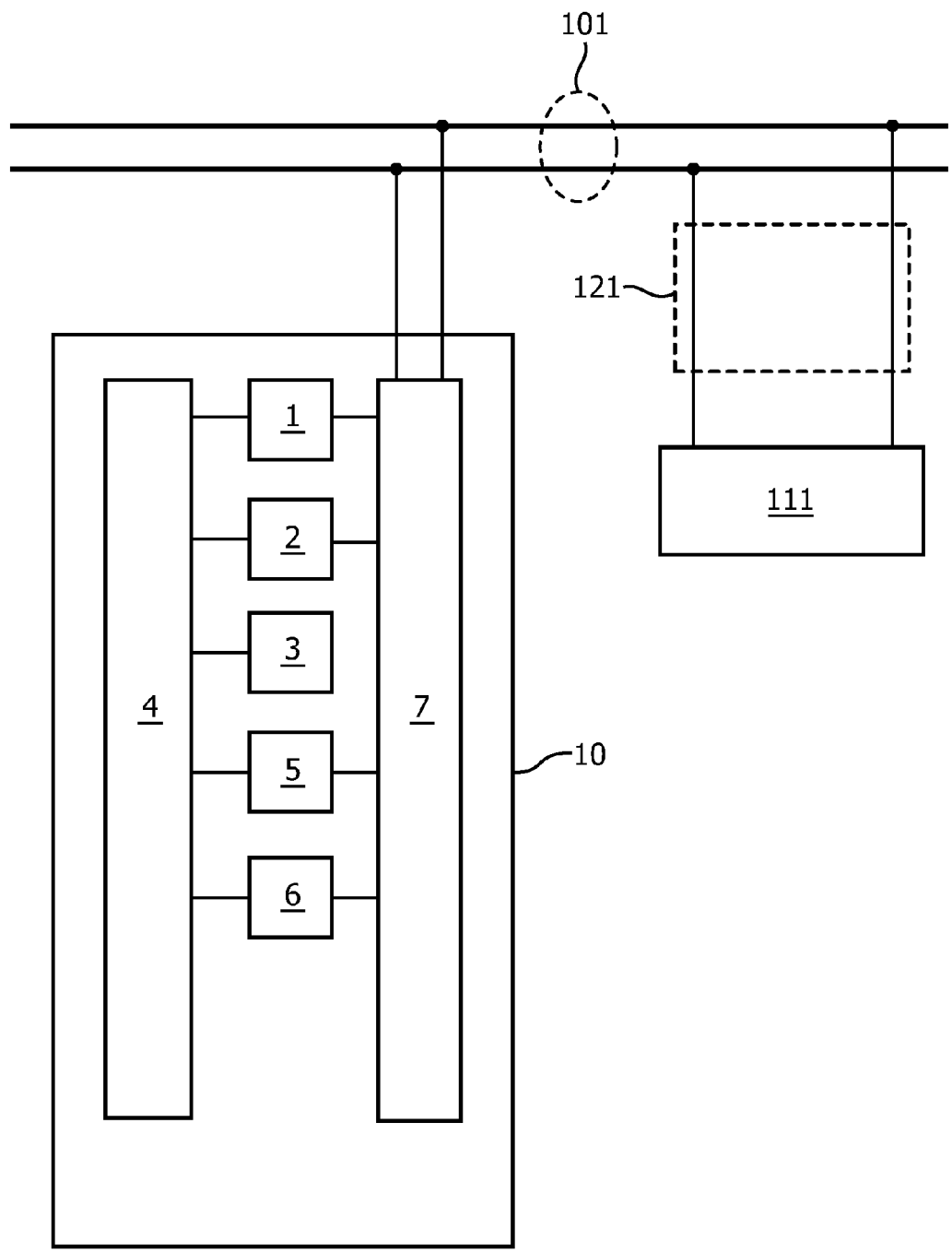
FIG. 3 shows an embodiment of a device.

In the FIG. 3, an embodiment of a device 10 is shown. The device 10 supports a use of an investigation signal for investigating the cable system as shown in the FIGS. 1 and 2, whereby the loads 111-115 each comprise a rectifier circuit with inputs coupled to the cable 101 and with outputs coupled to a storage circuit as further shown in the FIG. 4. The device 10 comprises a charger circuit 1 for producing a charging signal for charging the storage circuit. In case the cable system further comprises a signaling circuit 121 located between the load 111 and the cable 101, the device 10 may further comprise a discharger circuit 2 for discharging the signaling circuit 121 after being charged by the charger circuit 1. The device 10 may further comprise an investigation circuit 3 for producing the investigation signal, and a controller circuit 4 for controlling the other circuits 1-3. The device 10 may further comprise a reception circuit 5 for receiving a response to the investigation signal, and an analysis circuit 6 for analyzing the response in view of the investigation signal and for in response to an analysis result defining a problem 102, 103 and/or a location of a problem 102, 103.

The controller circuit 4 may further control the reception circuit 5 and the analysis circuit 6 and an interface 7 for interfacing the circuits 1-6 on the one hand and the cable 101 on the other hand. Alternatively, one or more of the circuits 1-3, 5, 6 may be realized via the controller circuit 4, or the controller circuit 4 may be integrated into one or more of the circuits 1-3, 5, 6. Two or more of the circuits 1-6 may be combined into a larger circuit. The interface 7 can be left out in case the circuits 1-6 do not need such an interface 7. Finally, a man-machine-interface may be present, or not.

So, the device 10 is located at a central-location and relatively away from the loads 111-115 at load-locations. In the FIGS. 2 and 3, left from the device 10 there may for example be a generator for generating a cable signal destined for the loads 111-115. Before charging, discharging and investigating, it might be necessary to disconnect such a generator or to place it into an offside position otherwise.

Figure 4:
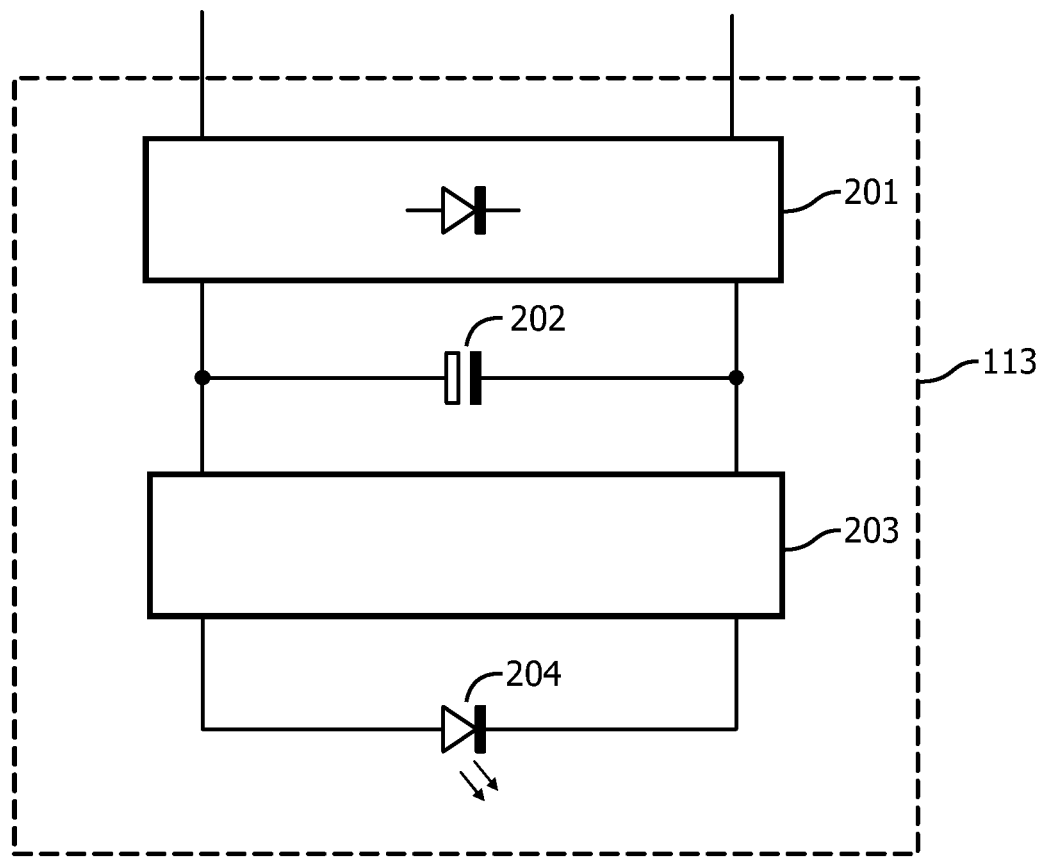
FIG. 4 shows a prior art load.

In the FIG. 4, a prior art load 113 is shown. This prior art load 113 comprises a rectifier circuit 201 such as for example a rectifier bridge with four diodes. Inputs of the rectifier circuit 201 are inputs of the load 113. Outputs of the rectifier circuit 201 are coupled to inputs of a dc-dc-converter 203 and to a storage circuit 202 such as for example one or more storage capacitors. Outputs of the dc-dc-converter 203 are coupled to one or more light emitting diodes 204 of whatever kind and in whatever combination.

In case the problem 102 has occurred and the signaling circuit 124 at the load 114 has been activated, or in case the problem 103 has occurred between the loads 114 and 115, a characteristic frequency of the cable system as to be measured by the device 10 via the investigation signal and its response may not be measured properly, owing to the fact that the storage circuit 202 in the load 113 located between the device 10 and the load 114 may have an impact on the measurement. Further, in one or more of said cases, the storage circuit 202 in the load 113 may absorb an investigation signal in the form of a pulse signal as produced by the device 10 or may reflect it too early. This will also result in improper measurements, owing to the fact that either no reflection will be generated (in case the investigation signal is absorbed by the storage circuit 202), or owing to the fact that a too early reflection will be generated (in case the investigation signal is reflected by the storage circuit 202).

To overcome this, before the investigation signal is generated, the charger circuit 1 produces the charging signal for charging the storage circuit 202 such that the charged storage circuit 202 will have, compared to the non-charged storage circuit 202, an at least reduced impact on a performance of the investigation signal, preferably no impact at all. As an example only, a voltage amplitude of the investigation signal may be chosen equal to or smaller than a sum of a voltage amplitude present across the rectifier circuit 201 and a voltage amplitude present across the charged storage circuit 202, to realize said no impact at all.

In case the signaling circuit 121 is present, when comprising one or more signaling capacitors, it may be charged as well by the charger circuit 1. Owing to the fact that a charged signaling circuit 121 can have an impact on the investigation signal as well, the signaling circuit 121 is to be discharged by the discharger circuit 2 such as for example a switch for short-circuiting the first and second conductors of the cable 101, before the investigation signal is generated.

Figure 5:
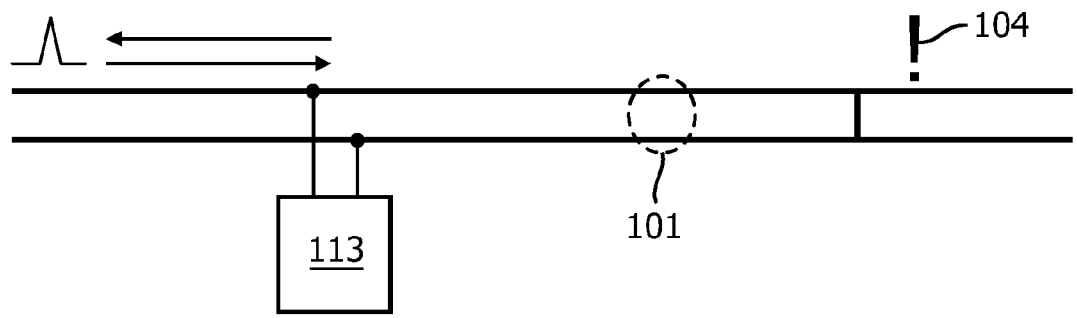
FIG. 5 shows a first situation.

In the FIG. 5, a first situation is shown, whereby an investigation signal in the form of a pulse signal is reflected by a non-charged storage circuit 202 in a load 113 before the pulse signal could have reached a problem 104 in the form of a "short" in the cable system.

Figure 6:
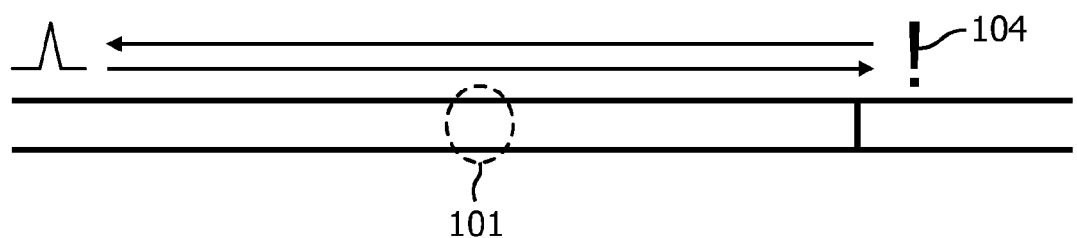
FIG. 6 shows a second and improved situation.

In the FIG. 6, a second and improved situation is shown, whereby an investigation signal in the form of a pulse signal is no longer reflected by a load 113 owing to the fact that a storage circuit 202 in the load 113 has been charged sufficiently. As a result, the pulse signal can now reach a problem 104 in the form of a "short" in the cable system and is reflected by this "short" such that a correct measurement can be performed.

Summarizing, devices 10 support a use of investigation signals for investigating cable systems comprising cables 101 and loads 111. The loads 111 comprise rectifier circuits 201 coupled to storage circuits 202. The devices 10 comprise charger circuits 1 for producing charging signals for charging the storage circuits 202 such that they have reduced impacts on performances of the investigation signals. The devices 10 may further comprise discharger circuits 2 for discharging signaling circuits 121 after being charged by the charger circuits 1. The devices 10 may further comprise investigation circuits 3 for producing the investigation signals and controller circuits 4 for controlling the other circuits 1-3 and reception circuits 5 for receiving responses to the investigation signals and analysis circuits 6 for analyzing the responses in view of the investigation signals and for in response to analysis results defining a problem 102-104 and/or a location of a problem 102-104.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for investigating a cable system comprising a cable and a load, the load comprising a rectifier circuit with inputs coupled to the cable and with outputs coupled to a storage circuit, the device comprising
    a charger circuit for producing a charging signal for charging the storage circuit;
    an investigation circuit for producing an investigation signal, and
    a controller circuit for controlling the charger circuit to producing the charging signal before the investigation circuit producing the investigation signal.

2. The device as defined in claim 1, a voltage amplitude of the investigation signal being equal to or smaller than a sum of a voltage amplitude present across the rectifier circuit and a voltage amplitude present across the charged storage circuit.

3. The device as defined in claim 1, the cable system further comprising a signaling circuit located between the load and the cable, the device further comprising
    a discharger circuit for discharging the signaling circuit after being charged by the charger circuit.

4. The device as defined in claim 1, further comprising
    a reception circuit for receiving a response to the investigation signal, and
    an analysis circuit for analyzing the response in view of the investigation signal and for in response to an analysis result defining a problem and/or a location of a problem.

5. A package system comprising the device as defined in claim 1 and further comprising another device with an investigation circuit for producing the investigation signal.

6. A cable system comprising a cable and a load, the load comprising a rectifier circuit with inputs coupled to the cable and with outputs coupled to a storage circuit, the cable system further comprising the device as defined in claim 1.

7. A method for investigating a cable system comprising a cable and a load, the load comprising a rectifier circuit with inputs coupled to the cable and with outputs coupled to a storage circuit, the method comprising a step of
    producing a charging signal for charging the storage circuit, and the method further comprising the following step after step of producing the charging signal,
    producing the investigation signal.

8. The method as defined in claim 7, a voltage amplitude of the investigation signal being equal to or smaller than a sum of a voltage amplitude present across the rectifier circuit and a voltage amplitude present across the charged storage circuit.

9. A computer program product for, when run on a computer, performing the step of the method as defined in claim 7.

10. A medium for storing and comprising the computer program product as defined in claim 9.

* * * * *